United States Patent [19]
Itoh et al.

[11] Patent Number: 5,438,207
[45] Date of Patent: Aug. 1, 1995

[54] ELECTRON BEAM DIRECT WRITING SYSTEM FOR ULSI LITHOGRAPHY WITH FACILITATED ROTATION AND GAIN CORRECTIONS OF SHOT PATTERNS AND ELECTRON BEAM DIRECT WRITING METHOD FOR SAME

[75] Inventors: Katsuyuki Itoh; Hiroshi Yamashita, both of Tokyo, Japan

[73] Assignee: NEC Corporation, Tokyo, Japan

[21] Appl. No.: 334,225

[22] Filed: Nov. 4, 1994

[30] Foreign Application Priority Data

Nov. 17, 1993 [JP] Japan .................. 5-287897

[51] Int. Cl.6 ........................................... H01J 37/304
[52] U.S. Cl. ................... 250/492.23; 250/441.1
[58] Field of Search ................. 250/492.23, 491.1

[56] References Cited

U.S. PATENT DOCUMENTS

| | | | |
|---|---|---|---|
| 4,742,233 | 5/1988 | Kuyel | 250/491.1 |
| 4,791,302 | 12/1988 | Nozue | 250/491.1 |
| 5,250,812 | 10/1993 | Murai et al. | 250/492.23 |

FOREIGN PATENT DOCUMENTS 0105711  4/1984  European Pat. Off. .......... 250/491.1

OTHER PUBLICATIONS by David H. Dameron et al., "A multiple exposure strategy for reducing butting erros in a raster-scanned electron-beam exposure system", *J. Vac. Sci. Technol.* B 6 (1), American Vacuum Society, Jan./Feb. 1988, pp. 213-215.

*Primary Examiner*—Jack I. Berman
*Attorney, Agent, or Firm*—Young & Thompson

[57] ABSTRACT

In an electron beam direct writing system having an aperture member, an evaluation aperture is provided for the aperture member for mapping evaluation patterns in a drawn pattern on a semiconductor substrate. Short lines having a predetermined width are arranged at first pitches in horizontal and vertical directions in peripheral portions of a first shot pattern to form a first line-/interval pattern. Similarly, short lines are arranged at second pitches slightly different from the first pitches in the horizontal and vertical directions in peripheral portions of second and third shot patterns to form second line/interval patterns. Quantities of rotation and gain of a shot are determined from matching positions between evaluation patterns of the shot patterns. It is permitted in a short period of time to adjust the exposure dose, correct positional errors such as a stitching error, align component members and achieve an evaluation on reproductivity.

7 Claims, 4 Drawing Sheets

F I G. 2
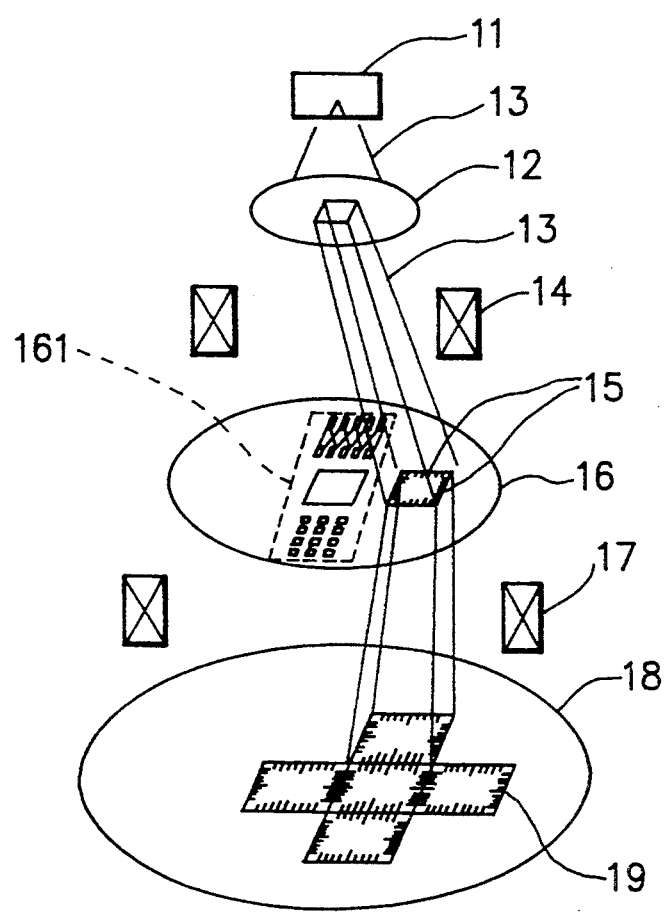

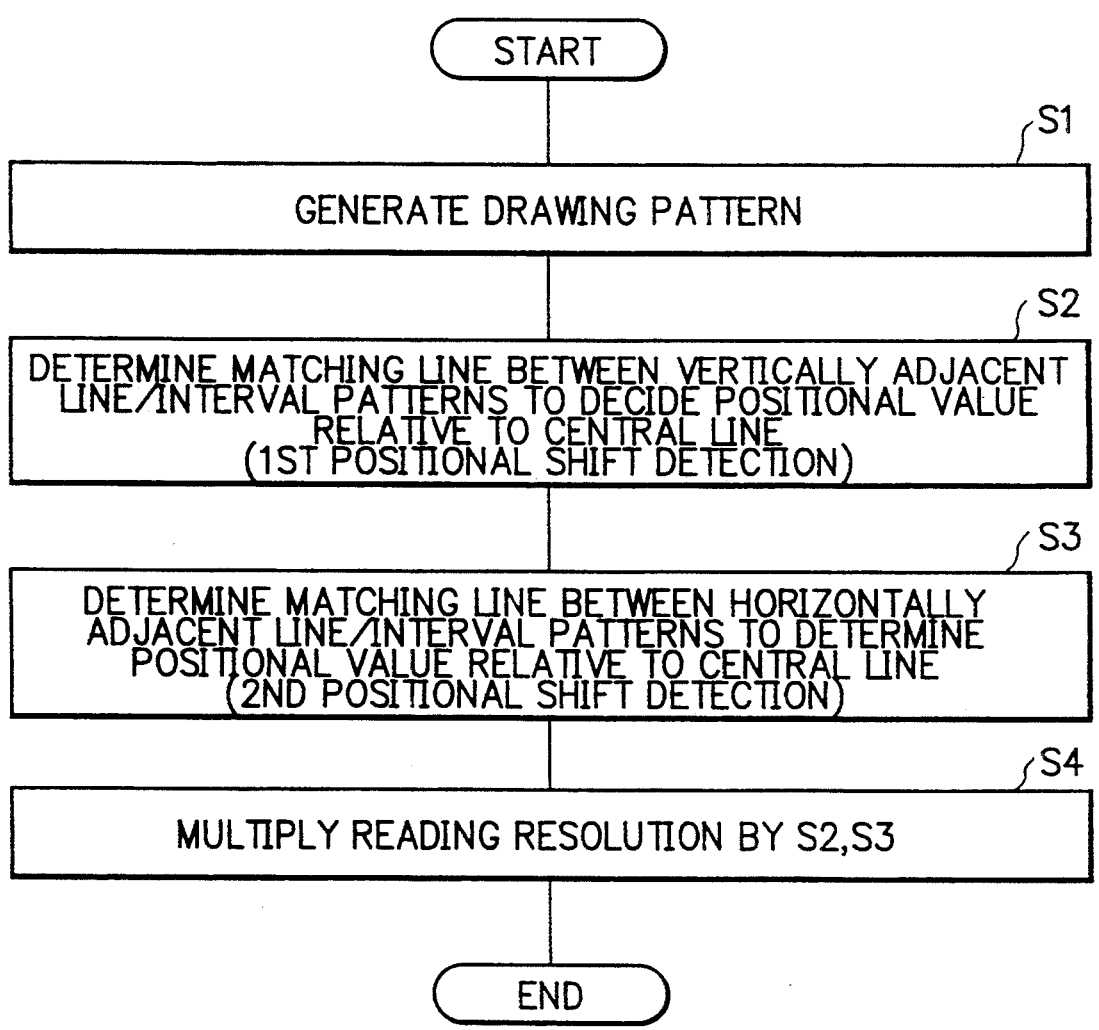

ELECTRON BEAM DIRECT WRITING SYSTEM FOR ULSI LITHOGRAPHY WITH FACILITATED ROTATION AND GAIN CORRECTIONS OF SHOT PATTERNS AND ELECTRON BEAM DIRECT WRITING METHOD FOR SAME

BACKGROUND OF THE INVENTION

The present invention relates to an electron beam direct writing system and an electron beam direct writing method for the same, and in particular, to an electron beam direct writing system as an electron beam exposure system for use in lithography for ULSI's (ultra large-scale integrated circuits), permitting facilitated rotation and gain corrections of shot patterns, and to an electron beam direct writing method for the same.

Description of the Related Art

The electron beam direct writing system has been and is indispensable in the art of lithography for fabricating ULSI's that are as large in scale as several millions or more in number of patterns and need enhanced levels of integration and precision techniques. The lithography is a process for giving a desired pattern to a semiconductor substrate.

For the lithography, the electron beam direct writing system is generally adapted to project a high-speed electron beam within an energy range of 5 KeV to 100 KeV, scanning over a resist film coated on a mask substrate or wafer, so that chemical reactions in the irradiated portions of the resist film can be utilized to obtain a desired pattern on the mask substrate or wafer. The electron beam is converged into a diameter of or a square with a side of 0.1 micrometer ($\mu$m) or less, permitting a high resolution. Moreover, the beam can be arbitrarily deflected through an electric and a magnetic field. A voluntary pattern is thus obtainable with a high precision, by controlling a beam deflecting scan signal from a computer.

The electron beam is categorized by the sectional form into a Gaussian beam and a shaped beam. The latter is shaped into a desired form through apertures of a corresponding sectional form, and is converged to have a homothetically reduced figure when irradiated for a mapping. In applications to electron beam direct writing systems for the lithography for ULSIs, it appears as a variable shaped beam having a varible sectional form defined through a pair of electro-optically superimposed appertures.

The variable shaped beam is inherently suitable for both high speed and high precision processes, thus contributing to the great demand for electron beam direct writing systems of a type having employed that beam for the lithography of ULSI's.

FIG. 1 shows a conventional electron beam direct writing system of such the type. The conventional system is constituted with an electron gun 111 for projecting an electron beam 113, a first and a second aperture member 112 and 116 vertically spaced apart from each other and arranged for cooperation to give the beam 113 a desired rectangular form, a deflector 114 interposed between the aperture members 112, 116 to serve as a shaping lens for producing a controlled rectangular pattern to a desired size, and an objective 117 for having the electron beam 113, as it has passed the second aperture member 116, focused to form a corresponding image at an exposed location on the surface of a semiconductor substrate 118 where the rectangular pattern is mapped to be directly written or drawn.

Description will now be given of a conventional electron beam direct writing method in the conventional system. Through a rectangular opening formed in the second aperture member 116, the electron beam 113 is let to pass to map the rectangular pattern at an arbitrary location on the semiconductor substrate 118. This mapping by a single exposure is herein called "one shot". For drawing a desired pattern, a series of shots are required to be sequentially performed, shifting the location of exposure on the substrate 118. In the drawing, any pair of consecutive shots that have their mapping areas naturally adjacent to each other on the substrate 118 are so effected that the mapping areas continuously neighbor each other, thereby permitting an evaluation pattern 181 to be drawn in a desired linear configuration. To conduct evaluations in both X and Y directions, a linear pattern is drawn in each of the X and Y directions. The drawn linear patterns may be combined in the form a letter L or in a cross form. A number of evaluation patterns may be drawn at separate locations on a semiconductor chip, as necessary.

The direct writing method further comprises the steps of adjusting the exposure dose, i.e. the quantity of electron beam irradiation, correcting positional errors of shot patterns such as a stitching error to thereby correct the rotation and gain thereof, aligning component members of the system, and evaluating the pattern reproductivity. As an example of this evaluation, a method has been discussed for reducing the stitching error between adjacent mapped stripes in an electron beam exposure system of the described type, at pages 213 to 215 of the Journal of Vacuum Science and Technology, Vol. B6, No. 1, Jan./Feb. 1988. The discussed method employs a step of achieving measurements of respective dimensions of and stitching errors between the stripes, as well as examinations on their configurations, by means of a line width measurement scanning electron microscope (SEM) or the like, before inputting resultant data such as of measured values to a controlling computer of the electron beam exposure system to thereby accomplish evaluations of described items.

In the conventional system and particularly in the example of the conventional method, a plurality of shots are performed via the second aperture member formed with the rectangular opening so as to have neighboring mapping areas adjacent to each other to produce desired patterns of which the dimensions are measured by an SEM, adjusting the exposure dose, aligning component members of the system, and correcting rotation and gain such as against a stitching error to thereby achieve a reproductivity evaluation, as described.

The use of an SEM takes a relatively long time for the measurement of dimensions and is troublesome, when compared with an optical microscope. Supposing the reading error of the SEM to be between 50 to 100 thousands (in terms of multiplication factor), an error limit must be about 0.03 $\mu$m. Since an abutment of resist where the obtained image is obscure and hence dimensional errors are likely to take place is to be directly measured, if it is separated, the dimensional errors may be further increased. To avoid such disadvantages, it is required to prepare a sample again.

These drawbacks lead to a problem of reduction in system throughput.

SUMMARY OF THE INVENTION

It is therefore an object of the present invention to provide an electron beam direct writing system and an electron beam direct writing method capable of adjusting the exposure dose, correcting rotation and gain of a shot, abutment and the like with an increased speed in a simple manner.

To achieve the object above, in accordance with the present invention, there is provided an electron beam direct writing system comprising an electron gun for supplying an electron beam, a first and a second aperture member vertically aligned for obtaining a desired rectangular pattern, a deflector as an electro-optical shaping lens interposed between the first and the second aperture member for creating a rectangular pattern of a desired size, and an objective for having the electron beam, as it has passed through the second aperture member, focused on a surface of a semiconductor substrate as an object of a mapping operation. The second aperture member comprises a shot aperture corresponding to a first, a second and a third shot as exposure operations of the electron beam to respectively map on the semiconductor substrate a first shot pattern of a rectangular figure having a predetermined size, a second shot pattern adjacent to the first shot pattern in a first direction and a third shot pattern adjacent to the first shot pattern in a second direction perpendicular to the first direction, and an evaluation aperture corresponding to evaluation patterns formed by mapping a first line/interval pattern in peripheral portions of the first shot pattern and second line/interval patterns in peripheral portions respectively of the second and the third shot pattern. The first line/interval pattern consists of short lines each having a predetermined width arranged at first pitches in the first and the second direction in the peripheral portions of the first shot pattern. The second line/interval patterns consist of the short lines arranged in the first and the second direction in the peripheral portions respectively of the second and the third shot pattern at second pitches slightly different from the first pitches.

Additionally, the first to the third shot pattern may preferably be respective patterns of LSI chips formed on the semiconductor substrate.

The first and the second pitches may preferrably have therebetween a main/auxiliary scale relationship such that:

$$L = u \cdot p = (u \pm 1)s$$

where, L is a total length of an auxiliary scale, u indicates a number of divisions of each of a main and the auxiliary scale, $s$ denotes a division length of the main scale, and P stands for a division length of the auxiliary scale.

In the scale relationship, each division of the main scale may also be further subdivided according to a relationship such that:

$$L = u \cdot p = (r \cdot u \pm 1)s$$

where, r = (number of subdivisions + 1)/division.

In this connection, there is favorably included a central line at a central point of each of the first line/interval pattern and the second line/interval patterns, the central line being slightly longer than other short lines.

In accordance with the present invention, there is also provided an electron beam direct writing method for use in an electron beam direct writing system including an electron gun for supplying an electron beam, a first and a second aperture member vertically aligned for obtaining a desired rectangular pattern, a deflector as an electro-optical shaping lens interposed between the first and the second aperture member for creating a rectangular pattern of a desired size, an objective for having the electron beam, as it has passed through the second aperture member, focused on a surface of a semiconductor substrate as an object of a mapping operation. The method comprises a pattern forming step of forming a first, a second, and a third shot pattern and an evaluation pattern by the second aperture member, including mapping on the semiconductor substrate the first shot pattern of a rectangular figure having a predetermined size, the second shot pattern adjacent to the first shot pattern in a first direction and the third shot pattern adjacent to the first shot pattern in a second direction perpendicular to the first direction, mapping a first line/interval pattern by arranging short lines each having a predetermined width at first pitches in the first and the second direction in peripheral portions of the first shot pattern and mapping second line/interval patterns by arranging short lines in the first and the second direction in peripheral portions respectively of the second and the third shot pattern at second pitches slightly different from the first pitches and cooperative with the first pitches to establish a main/auxilary scale relationship therebetween. The direct writing method further comprises a first positional difference detecting step of attaining a value in ordinal number of a matching line where a positional matching occurs between short lines respectively of the first line/interval pattern and either of the second line/interval patterns, the value in ordinal number being determined relative to a central line, a second positional difference detecting step of attaining a value in ordinal number of a matching line where a positional matching occurs between short lines respectively of the first line/interval pattern and the other of the second line/interval patterns, the value in ordinal number being determined relative to a central line, and a multiplying step of multiplying each of the values in ordinal number by a resolution of the main/auxiliary scale relationship determined from the first and the second pitches, thereby detecting real dimensional errors between the first, the second and the third shot pattern.

According to the subject matter of the present invention, therefore, a second aperture member maps on a semiconductor substrate a first shot pattern of a rectangular figure having a predetermined size, a second shot pattern adjacent to the first shot pattern in a first direction and a third shot pattern adjacent to the first shot pattern in a second direction perpendicular to the first direction. The second aperture member further maps a first line/interval pattern in peripheral portions of the first shot pattern and second line/interval patterns in peripheral portions respectively of the second and the third shot pattern. The first line/interval pattern includes short lines each having a predetermined width arranged at first pitches in the first and the second direction in the peripheral portions of the first shot pattern. The second line/interval patterns include the short lines arranged in the first and the second direction in the peripheral portions respectively of the second and the third shot pattern at second pitches slightly different from the first pitches. In consequence, dimensional errors between adjacent shot patterns can be determined by detecting matching positions respectively between the first line/interval pattern having the first pitches and each of the second line/interval patterns having the second pitches.

BRIEF DESCRIPTION OF THE DRAWINGS

The objects and features of the present invention will become more apparent from the consideration of the following detailed description taken in conjunction with the accompanying drawings wherein:

FIG. 2 is a block diagram schematically showing an embodiment of the electron beam direct writing system in accordance with the present invention;

FIG. 4 is a flowchart showing an embodiment of the electron beam direct writing method employed in the electron beam direct writing system.

DESCRIPTION OF THE PREFERRED EMBODIMENTS

Figure 1:
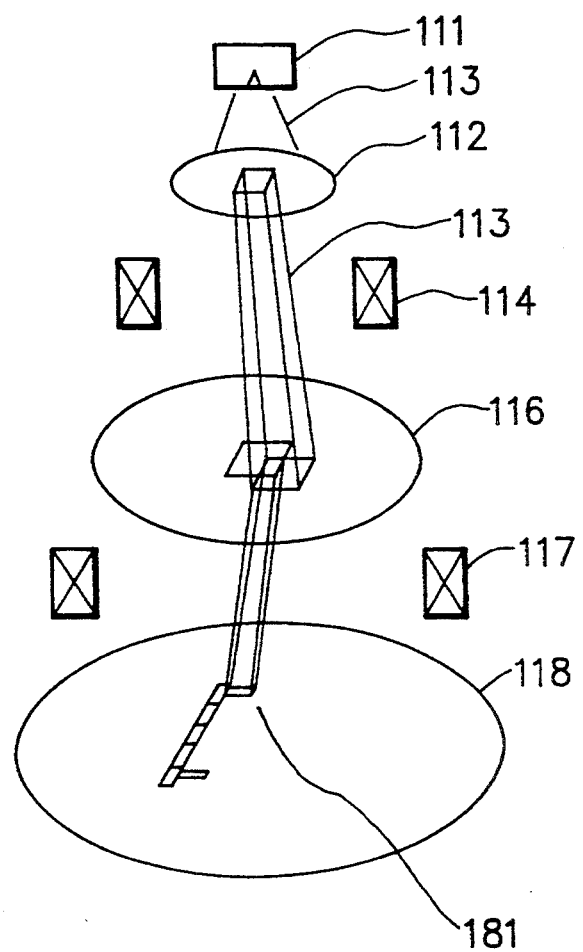
FIG. 1 is a schematic block diagram showing the construction of a conventional example of the electron beam direct writing system.
Figure 3:
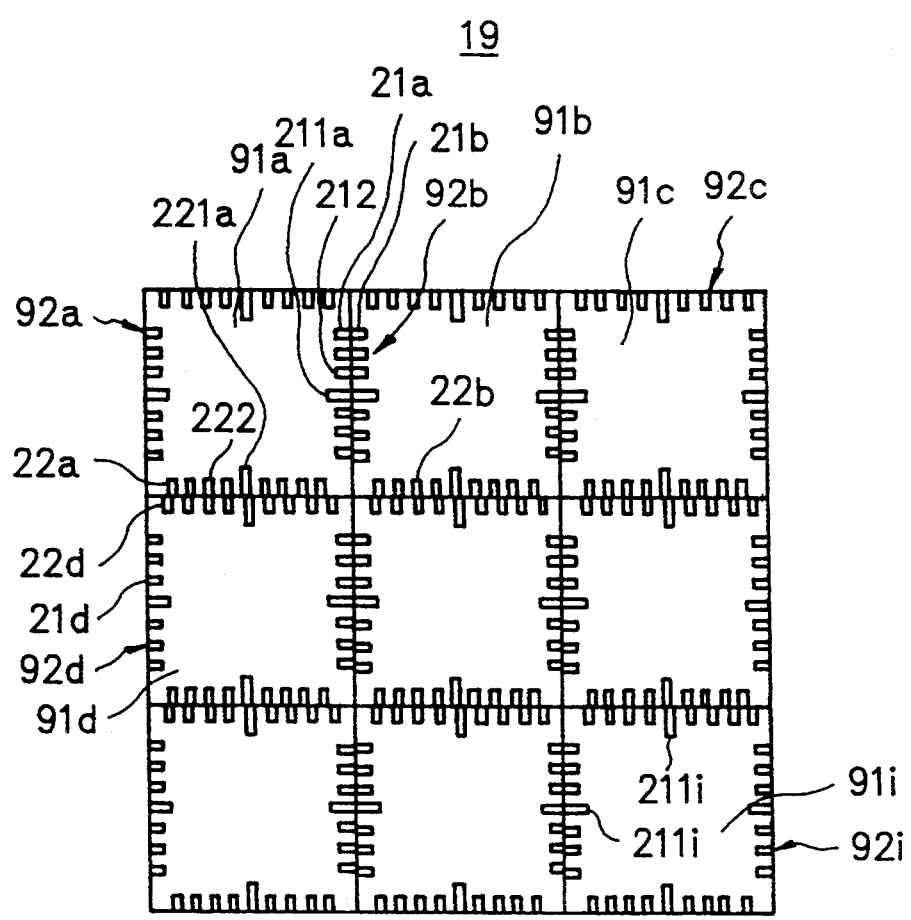
FIG. 3 is a schematic plan view illustratively showing part of a drawn pattern on a semiconductor substrate by the electron beam direct writing system of FIG. 2.

Referring now to the accompanying drawings, description will be given in detail of embodiments respectively of an electron beam direct writing system and an electron beam direct writing method in accordance with the present invention. FIGS. 2 to 4 show the embodiments.

FIG. 2 is a block diagram showing an embodiment of the electron beam direct writing system in accordance with the present invention. The direct writing system of the embodiment shown in FIG. 2 includes an electron gun 11 for supplying an intensity controllable electron beam 13, a first aperture member 12, a deflector 14, an objective 17 for focusing the electron beam 13 on a surface of a semiconductor substrate 18 as an object of later described mapping operations, i.e. exposure operations, a shot aperture 161, and a second aperture member 16 having an evaluation aperture 15.

The first aperture member 12 and the second aperture member 16 are arranged between the electron gun 11 and the semiconductor substrate 18, at controllable locations vertically spaced apart from each other, so that they are cooperative with each other to define a mapping pattern varible in form. The deflector 14 is interposed between the first and second aperture members 12, 16, and is operable to give a controllable size to the mapping pattern.

In the system, the shot aperture 161 serves at each related shot for mapping a square shot pattern (one of shot patterns 91a to 91i shown in FIG. 3) that corresponds to an LSI chip or VLSI chip in a drawn LSI or VLSI pattern 19 on the semiconductor substrate 18. The pattern 19 is drawn by a sequence of shots, in the form of a lattice consisting of a plurality of adjacent rectangular regions corresponding to the mapped shot patterns 91a to 91i (hereinafter collectively referred to as "91").

The second aperture member 16 serves for mapping an evaluation pattern 92a to 92i (hereinafter collectively referred to "92") in each shot pattern 91, and includes an evaluation aperture 15 for mapping two kinds of line/interval patterns 21a, 22a, 21b, 22b . . . 21d, 22d . . . (hereinafter collectively referred to "21, 22" or "21" and/or "22") which constitute the evaluation pattern 92 and each of which consists of a sequence of laterally extending bar-like short lines spaced apart from each other in the longitudinal direction of the pattern 15. The line/interval patterns 21, 22 are mapped in four peripheral portions of each shot pattern 91, i.e. along the lengths of four edges or sides thereof, at the inside. In each line/interval pattern 21, 22, the lateral short lines have a predetermined width in the longitudinal direction of the pattern 21, 22, and are arranged at intervals or pitches of a predetermined distance in the longitudinal direction that is a vertical (in figure) or a first direction of the shot pattern 91 or in a horizontal (in figure) or a second direction thereof perpendicular to the first direction. The line pitches in either kind of the line/interval pattern 21, 22 hereinafter referred to "first line-/interval pattern") are different from those in the other kind of the line/interval pattern 21, 22 (hereinafter referred to "second line/interval pattern"). Moreover, the line pitches are different between adjacent two of the line/interval patterns 21, 22, and hence between both sides of a boundary line that intervenes between arbitrary two of the shot patterns 91 adjacent to each other in the horizontal or the vertical direction. In other words, either of the first and the second line/interval pattern 21, 22 is mapped at either side of the boundary line, and the other at the other side thereof. The evaluation aperture 15 is formed with a combination of square-arranged four patterns: adjacent two thereof each respectively corresponding to the first line/interval pattern 21, 22, and the other two each respectively corresponding to the second line/interval pattern 21, 22. There may be provided a pair of evaluation apertures either having a combination of square-arranged four patterns each respectively corresponding to the first line/interval pattern 21, 22 and the other having likewise arranged four patterns each respectively corresponding to the second line/interval pattern 21.22, respectively for a mapping thereof onto each of staggeredly arranged shot patterns 91.

Referring to FIG. 3, there are schematically and partially shown the drawn pattern 19 including the shot patterns 91 and the evaluation patterns 21, 22 mapped alongside respective boundaries of the shot patterns 91. In the horizontal and the vertical direction of the drawn pattern 19 are arranged three rows of the shot patterns 91 and three columns thereof. Namely, the shot patterns 91 are exemplarily mapped, nine in number, to be adjacent to each other. For simplification, description will be given of a relationship between the shot patterns 91a and 91b horizontally adjacent to each other and that between the shot patterns 91a and 91d vertically adjacent to each other.

The evaluation pattern 92 mapped in the periphery of the shot pattern 91a has the first line/interval pattern 21a consisting of the short lines designated at numeral 212 and vertically arranged at pitches of a predetermined distance s, with a central one 211a of the short lines slightly but significantly longer than others, and the first line/interval pattern 22a consisting of the short lines designated at numeral 222 and horizontally arranged at pitches of the distance s, with a central one 211a of the short lines slightly but significantly longer than others.

The evaluation patterns 92b and 92d mapped in the the shot patterns 91b and 91d, respectively, have the second line/interval patterns 21b and 22d vertically and horizontally arranged therein, respectively, while further including the second line/interval pattern 21d in the shot pattern 91d as well as the first line/interval pattern 22b in the shot pattern 91b. Each of the second line/interval patterns 21b and 22D consists of the short lines arranged at pitches of a predetermined distance p which is slightly different from the pitch distance s and which has a predetermined relationship with the pitch p.

There exists a main/auxiliary scale relationship between the first and the second line/interval patterns 21a and 21b or 22a and 22d that are adjacent to each other, in which the first line/interval pattern constitutes a main scale and the second line/interval pattern constitutes an auxiliary scale, whereas this relation may be vice versa. The relationship will now be described in detail.

In the relationship between the main scale and the auxiliary scale or a vernier, the latter is used to further subdivide the former to obtain a smaller unit for measurement. The main and the auxiliary scales have a relationship established therebetween such that:

$$L = u \cdot p = (u \pm 1)s \quad (1)$$

where, L is the total length of the auxiliary scale, u stands for the number of divisions of each of the main and the auxiliary scales, s indicates the length of one division of the main scale, and p denotes the length of one division of the auxiliary scale.

According to expression (1), the division length p of the auxiliary scale is obtained by equally dividing by u the length (u+1)s associated with the number of divisions "u±1". That is, this relationship is represented as p={(u+1)s}/u, which leads to expression (1). In the description above. "u±1" designates the division indicated by "u−1" or "u+1".

Moreover, there may be employed a scale for further subdividing each division of the main scale. In that scale, the following expression holds, where r indicates the number of subdivisions of each division of the main scale.

$$L = u \cdot p = (r \cdot u \pm 1)s \quad (2)$$

where, r=(number of subdivisions+1)/division.

In the case such a subdividing scale is not employed, namely, the number of subdivisions o, r becomes unit and hence expression (2) is identical to expression (1). In general, the value of r is set to one or two.

The division lengths s and p in expression (1) and (2) are respectively associated with the pitch distances s and p, which are set in this embodiment to 1.00 μm and 1.02 μm, respectively. Consequently, the number of divisions of the main scale corresponding to the pitch distance s becomes 50: whereas, the length of the auxiliary scale is obtained as 50 times the pitch distance p, namely. 51 μm. Resultantly, the resolution for measurement is 1/50 of the pitch distance s, namely, 0.02 μm. The number of subdivisions is "0" in the present embodiment.

FIG. 8 showing the details of the drawn pattern 19 includes, in addition to the shot pattern 91, the evaluation patterns 92 associated with the evaluation aperture 15. Unless no discrepancy or error exists between the shot patterns 91a and 91b horizontally adjacent to each other, the central line 211a of the first line/interval pattern 21a lo matches the central line of the second line/interval pattern 21b. If such a positional error is present, one of the short lines of the vertically extending first line/interval pattern 21a in the shot pattern 91a just or substantially coincides with or matches one of the short lines of the vertically extending second line/interval pattern 21b in the shot pattern 91b, but the central lines thereof do not. By detecting a coincident line or the matching short lines in terms of a distance in ordinal number of short lines counted from the central line 211, it is possible to detect the offset amount or shift of a vertical positional error incurred due to an imperfect rotation or gain control of a shot, between the shot patterns 91a and 91b.

For the shot patterns 91a and 91d vertically adjacent to each other, a horizontal positional error therebetween can also be detected in a similar manner.

Operation of the direct writing system will now be described by reference to FIGS. 2 and 3 and the flowchart of FIG. 4 in accordance with an embodiment of the electron beam direct writing method of the present invention. On the semiconductor substrate 18, there are effected several shots of the electron beam 13 to draw a predetermined pattern 19 (step S1). Subsequently, the drawn pattern 19 thus created is observed by an optical microscope to determine a matching line between the line/interval patterns 21a and 21b respectively of the adjacent shot patterns 91a and 91b, to record a distance or positional value relative to the central line 211a (step S2). In this example, a first upper line 211 with respect to the central line 211a is the matching line and a distance of "+1" is written in an unshown memory, as a detected value to be recorded.

Next, likewise, a matching line is detected between the line/interval patterns 22a and 22d and a detected value is recorded (step S3). In this example, a second line 222 on the left-hand side of the central line 211a is the matching line, so that the detected value is "2".

To determine the quantity of a spatial shift (the offset amount in terms of an ordinary unit of length) from the central line 211 or 221, each of the detected values at the steps S2 and S3 is multiplied by a reading resolution (0.02 μm) of the line/interval pattern. In this case, there is calculated a shift of +0.02 μm in the vertical direction, and +0.04 μm in the horizontal direction. Similarly, for the respective line/interval patterns 21, 22 of the evaluation patterns 92, the steps S2 to S4 are sequentially executed.

As will be seen from the foregoing description, according to the present invention, a second aperture member includes a shot aperture corresponding to a first, a second and a third shot pattern horizontally and vertically adjacent to each other on a semiconductor substrate and an evaluation aperture corresponding to evaluation patterns produced by drawing a first and a second line/interval pattern. In the first line/interval pattern, short lines are arranged at first pitches in peripheral portions of the first shot pattern in the vertical and horizontal directions. In the second line/interval patterns, short lines are arranged at second pitches slightly different from the first pitches, in peripheral portions of the second and the third shot pattern in the vertical and horizontal directions. This arrangement permits a main/auxiliary scale relationship to be established between the first and the second line/interval pattern on the semiconductor substrate. Consequently, between the first to the third shot pattern adjacent to each other, positional errors can be optically and easily detected in a short period of time, permitting an improved system throughput.

The evaluation patterns are mapped directly in the periphery of a LSI chip, and the period of time for preparing a sample can be dispensed with. Moreover, it is unnecessary to directly measure dimensions of an abutment error in resist film, so that the cause of conventional dimensional errors can be eliminated.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An electron beam direct writing system, comprising:
    an electron gun for supplying an electron beam:
    a first and a second aperture member vertically aligned for obtaining a desired rectangular pattern:
    a deflector as an electro-optical shaping lens interposed between the first and the second aperture member for creating a rectangular pattern of a desired size:
    an objective for having the electron beam, as it has passed through the second aperture member, focused on a surface of a semiconductor substrate as an object of a mapping operation:
    the second aperture member including a shot aperture corresponding to a first, a second and a third shot as exposure operations of the electron beam for respectively mapping on the semiconductor substrate a first shot pattern of a rectangular figure having a predetermined size, a second shot pattern adjacent to the first shot pattern in a first direction and a third shot pattern adjacent to the first shot pattern in a second direction perpendicular to the first direction, and an evaluation aperture corresponding to evaluation patterns formed by mapping a first line/interval pattern in peripheral portions of the first shot pattern and second line/interval patterns in peripheral portions respectively of the second and the third shot pattern:
    the first line/interval pattern including short lines each having a predetermined width arranged at first pitches in the first and the second direction in the peripheral portions of the first shot pattern: and
    the second line/interval patterns including the short lines arranged in the first and the second directions in the peripheral portions respectively of the second and the third shot pattern at second pitches slightly different from the first pitches.

2. An electron beam direct writing system as claimed in claim 1, wherein the first, the second and the third shot pattern are respective patterns of LSI chips formed on the semiconductor substrate.

3. An electron beam direct writing system as claimed in claim 1, wherein the first and the second pitches have a main/auxiliary scale relationship established therebetween.

4. An electron beam direct writing system as claimed in claim 3, wherein the main/auxiliary scale relationship is established such that:

$$L = u \cdot p = (u \pm 1)s$$

where, L is a total length of an auxiliary scale, u indicates a number of divisions of each of a main and the auxiliary scale, s denotes a division length of the main scale, and p stands for a division length of the auxiliary scale.

5. An electron beam direct writing system as claimed in claim 4, wherein each division of the main scale is further subdivided according to a relationship such that:

$$L = u \cdot p = (r \cdot u + 1)s$$

where, r = (number of subdivisions + 1)/division.

6. An electron beam direct writing system as claimed in claim 1, further including a central line at a central point of each of the first line/interval pattern and the second line/interval patterns, the central line being slightly longer than other short lines.

7. An electron beam direct writing method for use in an electron beam drawing apparatus including an electron gun for supplying an electron beam, a first and a second aperture member vertically aligned for obtaining a desired rectangular pattern, a deflector as an electro-optical shaping lens interposed between the first and the second aperture member for creating a rectangular pattern of a desired size, and an objective for having the electron beam, as it has passed through the second aperture member, focused on a surface of a semiconductor substrate as an object of a mapping operation, the method comprising:
    a pattern forming step of forming a first, a second, and a third shot pattern and an evaluation pattern by the second aperture member, including mapping on the semiconductor substrate the first shot pattern of a rectangular figure having a predetermined size, the second shot pattern adjacent to the first shot pattern in a first direction and the third shot pattern adjacent to the first shot pattern in a second direction perpendicular to the first direction, mapping a first line/interval pattern by arranging short lines each having a predetermined width at first pitches in the first and the second direction in peripheral portions of the first shot pattern and mapping second line/interval patterns by arranging short lines in the first and the second direction in peripheral portions respectively of the second and the third shot pattern at second pitches slightly different from the first pitches and cooperative with the first pitches to establish a main/auxiliary scale relationship therebetween;
    a first positional difference detecting step of attaining a value in ordinal number of a matching line where a positional matching occurs between short lines respectively of the first line/interval pattern and either of the second line/interval patterns, the value in ordinal number being determined relative to a central line;
    a second positional difference detecting step of attaining a value in ordinal number of a matching line where a positional matching occurs between short lines respectively of the first line/interval pattern and the other of the third line/interval patterns, the value in ordinal number being determined relative to a central line; and
    a multiplying step of multiplying each of the values in ordinal number by a resolution of the main/auxiliary scale relationship determined from the first and the second pitches, thereby detecting real dimensional errors between the first, the second, and the third shot pattern.

* * * * *